(12) United States Patent
Shin (10) Patent No.: US 11,211,444 B2
(45) Date of Patent: Dec. 28, 2021

(54) DISPLAY APPARATUS

(71) Applicant: LG Display Co., Ltd., Seoul (KR)

(72) Inventor: Junghoon Shin, Gimpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 182 days.

(21) Appl. No.: 16/682,879

(22) Filed: Nov. 13, 2019

(65) Prior Publication Data

US 2020/0168694 A1 May 28, 2020

(30) Foreign Application Priority Data

Nov. 27, 2018 (KR) .................. 10-2018-0147991

(51) Int. Cl.
*H01L 27/32* (2006.01)
*H01L 51/52* (2006.01)

(52) U.S. Cl.
CPC ........ *H01L 27/3276* (2013.01); *H01L 27/323* (2013.01); *H01L 51/5203* (2013.01)

(58) Field of Classification Search
CPC ... H01L 27/32; H01L 27/323; H01L 27/3232; H01L 27/3241; H01L 27/3248; H01L 27/3276; H01L 27/3288; H01L 51/0096; H01L 51/50; H01L 51/5203–5234
See application file for complete search history.

(56) References Cited

U.S. PATENT DOCUMENTS 10,170,662 B2 * 1/2019 Aoyama ............ H01L 51/0097
10,571,759 B2 * 2/2020 Osawa .................. G02F 1/1345
2013/0056714 A1 * 3/2013 Hasegawa .......... H01L 27/3276 257/40
2015/0185942 A1 * 7/2015 Kim ...................... G06F 3/0445 345/173
2019/0198799 A1 * 6/2019 Lee ..................... H01L 27/3262

FOREIGN PATENT DOCUMENTS

| EP | 2302981 A1 | 3/2011 |
| JP | 2016-109771 A | 6/2016 |
| JP | 2018-010309 A | 1/2018 |
| JP | 2018-017988 A | 2/2018 |

OTHER PUBLICATIONS

Japanese Office Action dated Jan. 26, 2021 issued in corresponding Patent Application No. JP 2019-213026 w/English Translation (6 pages).
European Search Report dated Mar. 19, 2020 issued in corresponding Patent Application No. 19207449.0 (6 pages).

* cited by examiner

*Primary Examiner* — Andres Munoz (74) *Attorney, Agent, or Firm* — Polsinelli PC (57) ABSTRACT

A display apparatus may include a metal substrate, an electroluminescence display panel, including a first contact hole and a base voltage pad adjacent to the first contact hole, on the metal substrate, a first adhesive member, including a second contact hole exposing at least a portion of the base voltage pad, on the electroluminescence display panel, and a conductive filler, filled in the first contact hole and the second contact hole, electrically connecting the metal substrate and the base voltage pad.

22 Claims, 7 Drawing Sheets

DISPLAY APPARATUS

CROSS REFERENCE TO RELATED APPLICATION

This application claims the priority of Republic of Korean Patent Application No. 10-2018-0147991 filed on Nov. 27, 2018, which the content of the aforementioned application is hereby incorporated by reference in its entirety.

BACKGROUND

Field of the Disclosure

The present disclosure relates to a display device, and more particularly, to a contact structure of a base voltage pad of a display device including an electroluminescence display panel.

Description of the Background

The electroluminescence display panel receives an image signal and displays an image on the display area. The electroluminescence display panel can be implemented with an electroluminescence element such as a micro light emitting diode (Micro LED), an organic light emitting diode (OLED), a quantum-dot light emitting diode (QLED), and the like.

A display device including a conventional electroluminescence display panel displays an image through a display area where a plurality of pixels is formed. The pixels of the display device can emit light of a specific wavelength by stacking an anode, an electroluminescence element, and a cathode sequentially. The cathode is configured to cover the entire display area. Each pixel supplies a current corresponding to a video signal to an anode by a driving transistor, a base voltage is supplied to the cathode, and a brightness corresponding to the video signal can be emitted at the electroluminescence element.

SUMMARY

The inventors of the present disclosure have recognized that the quality of an image may be degraded if the base voltage supplied to the cathode of the display apparatus is not stable.

The inventors of the present disclosure have recognized that the reduction of the width of the signal wirings according to the enlargement of the display area and the increase in resolution of the electroluminescence display panel increase the electric resistance of the signal wirings. It has been recognized that as the signal wiring resistance increases, the maximum brightness can be decreased toward the center of the display area.

The inventors of the present disclosure have recognized that the image quality can be improved by stably supplying the base voltage to the cathode.

Thus, the inventors of the present disclosure have attempted to improve the stability of the supply of the base voltage by connecting the printed circuit board supplying the video signal to the electroluminescence display panel and the base voltage pad formed in the periphery area of the electroluminescence display panel.

Thus, the inventors of the present disclosure used a conductive tape to connect the base voltage pad of the electroluminescence display panel to the printed circuit board. However, it is recognized that it is difficult to secure a sufficient space in the periphery area, and it has been recognized that as the periphery area increases, the area of the display area can be reduced. In addition, it has been recognized that the application of the conductive tape may increase the complexity of the assembly process and the manufacturing cost.

Accordingly, a problem to be solved by the present disclosure is to provide a display apparatus in which a contact hole passing through an electroluminescence display panel is formed to stabilize a base voltage.

The problems to be solved by the present disclosure are not limited to the above-mentioned problem to be solved by the present disclosure, and other problems to be solved by the present disclosure not mentioned can be clearly understood by those skilled in the art from the following description.

According to the aspects of the present disclosure, a display apparatus may include a metal substrate, an electroluminescence display panel, including a first contact hole and a base voltage pad adjacent to the first contact hole, on the metal substrate, a first adhesive member, including a second contact hole exposing at least a portion of the base voltage pad, on the electroluminescence display panel; and a conductive filler, filled in the first contact hole and the second contact hole, electrically connecting the metal substrate and the base voltage pad.

An area of the second contact hole may be wider than an area of the first contact hole.

The base voltage pad may be electrically connected to a cathode of the electroluminescence display panel.

The display apparatus may include a printed circuit board electrically connected to the electroluminescence display panel and/or the metal substrate.

The display apparatus may include a back plate, disposed between the electroluminescence display panel and the metal substrate, including the first contact hole.

The display apparatus may include a polarizer, disposed on the electroluminescence display panel, configured to expose at least a portion of the base voltage pad.

The display apparatus may include a cover member, disposed on the first adhesive member, configured to cover the first contact hole and the second contact hole.

The display apparatus may include a light shielding layer, disposed under a bottom surface of the cover member, configured to light shield the first contact hole and the second contact hole.

The display apparatus may include a touch panel including the second contact hole, disposed on the electroluminescence display panel.

The display apparatus may include a second adhesive member including the second contact hole, disposed between the touch panel and the electroluminescence display panel.

The display apparatus may include a light controlling film including the second contact hole, disposed on the electroluminescence display panel.

The display apparatus may include a third adhesive member including the second contact hole, disposed between the light controlling film and the electroluminescence display panel.

The first contact hole may be formed by a laser.

The second contact hole may be formed by a laser.

The display apparatus may be divided into a display area and a periphery area, and at least one of the first contact hole, the second contact hole and the base voltage pad may be provided in the periphery area.

The cathode may be a common electrode covering a display area of the display apparatus and extending to a portion of a periphery area of the display apparatus to be electrically connected to the base voltage pad provided in the periphery area.

According to the aspects of the present disclosure, a display apparatus may include an electroluminescence display panel including a display area in which a plurality of pixels is arranged and a cathode is formed, a periphery area in which a base voltage pad electrically connected to the cathode is formed, and a first contact hole passing through a substrate on which the plurality of pixels is formed and disposed adjacent to the display area, and a metal substrate, in contact with a conductive filler covering the first contact hole and at least a portion of an upper surface of the base voltage pad, disposed under a bottom surface of the electroluminescence display panel.

The display apparatus may include a cover member covering the first contact hole, disposed on the electroluminescence display panel.

At least one among a polarizer, a touch panel, and a light controlling film may be further disposed between the electroluminescence display panel and the cover member, and the further disposed at least one element may correspond to the first contact hole and may include a second contact hole configured to expose at least a portion of the upper surface of the base voltage pad.

An adhesive member may be disposed on at least one of an upper surface and a bottom surface of the further disposed at least one element.

The adhesive member may include a second contact hole.

The first contact hole and the second contact hole that are plural may be disposed in the periphery area.

The details of the aspects of the present disclosure are included in the detailed description and drawings.

The display apparatus according to the aspects of the present disclosure has effects of stably supplying a base voltage to the cathode and improving the image quality according to a contact hole structure formed in an electroluminescence display panel and a metal substrate overlapping the contact hole structure arranged in the electroluminescence display panel.

The effects according to the present disclosure are not limited by the contents exemplified above, and more various effects are included in the present disclosure.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Advantages and characteristics of the present disclosure and a method of achieving the advantages and characteristics will be clear by referring to the aspects described below in detail together with the accompanying drawings. However, the present disclosure is not limited to the aspect disclosed herein but will be implemented in various forms. The aspects are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the various aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range (e.g., a tolerance range) even if not expressly stated.

When the position relation between two elements is described using the terms such as "on", "above", "below", and "next", one or more elements may be positioned between the two portions unless the terms are used with the term "immediately" or "directly".

When an element or a layer is "on" another element or another layer, it may be interpreted as such the other layer or the other element can be interposed on or in the middle of another element.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals refer to like elements throughout the specification.

Size and thickness of each element shown in the figures are merely for illustrative purpose for convenience of description, but are not necessarily limited to the size and thickness of the configuration of the present disclosure as illustrated.

Each of the features of the various aspects of the present disclosure can be combined or combined with each other partly or entirely. The features of the various aspects can be technically interlocked and driven as well. The features of the various aspects can be practiced independently or in conjunction with each other independently of each other.

Hereinafter, various aspects of the present disclosure will be described in detail with reference to accompanying drawings.

Figure 1A:
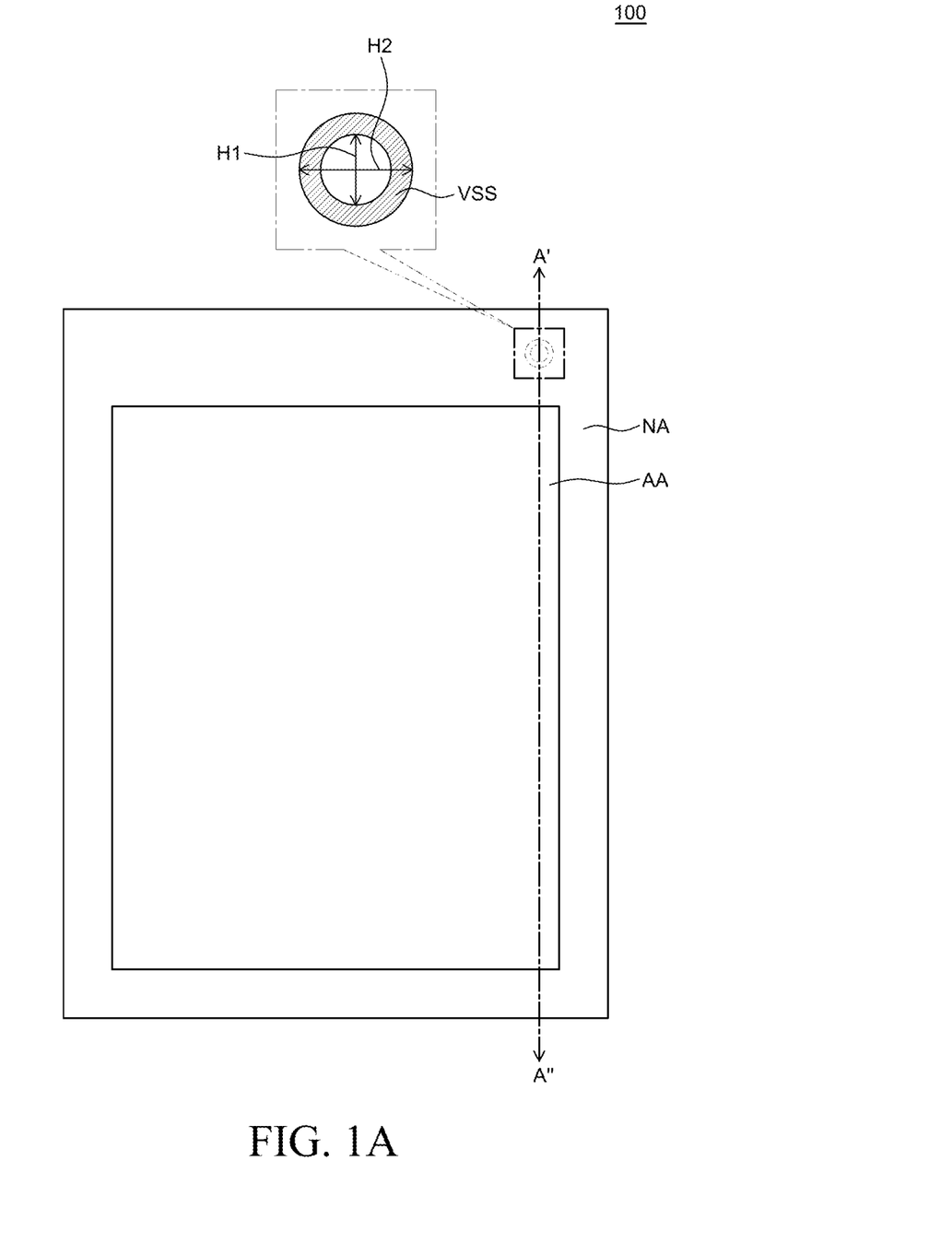
FIG. 1A is a plan view schematically illustrating a display apparatus according to an aspect of the present disclosure.

FIG. 1A is a plan view schematically illustrating a display apparatus according to an aspect of the present disclosure.

Figure 1B:
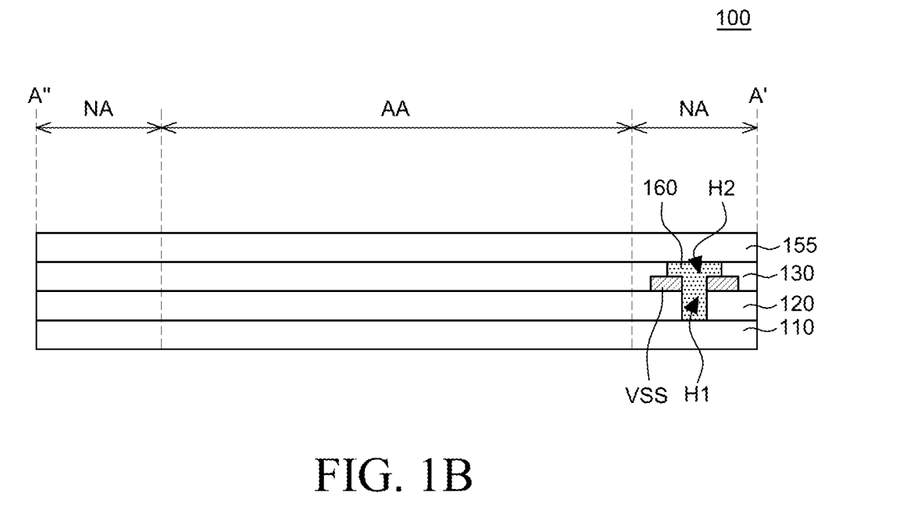
FIG. 1B is a cross-sectional view schematically illustrating the cross-section A'-A" of FIG. 1A.

FIG. 1B is a cross-sectional view schematically illustrating the cross-section A'-A" of FIG. 1A.

Hereinafter, a display apparatus 100 according to an aspect of the present disclosure will be described with reference to FIGS. 1A and 1B.

Referring to FIG. 1A, a display apparatus 100 according to an aspect of the present disclosure may be configured to include a display area AA and a periphery area NA. The contact hole structures H1, H2, and VSS may be disposed in the periphery area NA.

A plurality of pixels may be arranged in the display area AA. The plurality of pixels may be configured to emit visible light of a specific wavelengths band based on the image signal supplied through the thin film transistor array. Therefore, the display apparatus 100 can display an image. The display area AA may be formed on the electroluminescence display panel 120.

The periphery area NA may be arranged with various signal wirings and various driving circuits for driving a plurality of pixels arranged in the display area AA. The periphery area NA may be disposed around the display area AA. The display area AA is also referred to as active area AA, and the periphery area NA is also referred to as non-active area NA. The periphery area NA may be formed with contact hole structures H1, H2, and VSS configured to supply a base voltage. The contact hole structure H1, H2, and VSS may be configured to include at least a first contact hole H1, a second contact hole H2, and a base voltage pad VSS.

Referring to FIG. 1B, a display apparatus 100 according to an aspect of the present disclosure may include at least a metal substrate 110, an electroluminescence display panel 120, a first adhesive member 130, and a conductive filler 160 and by configuring a contact hole structures H1, H2, and VSS, stability of supplying the base voltage can be improved. The display apparatus may have one or more such contact hole structures H1, H2, and VSS and one or more or all of such contact hole structures H1, H2, and VSS may be disposed in the periphery area NA. None of such contact hole structures H1, H2, and VSS may be disposed in the display area AA.

The metal substrate 110 may be configured to be supplied with a base voltage. The base voltage may refer to a voltage supplied to the cathode of the electroluminescence display panel 120. The base voltage may be a ground level voltage (GND) or a voltage less than 0V. However, the present disclosure is not limited thereto. The metal substrate 110 may include a metal or a conductive material having excellent conductivity. For example, the metal substrate 110 may be copper (Cu), aluminum (Al), or the like. However, the present disclosure is not limited thereto.

The electroluminescence display panel 120 may be disposed on the metal substrate 110 directly as for example shown in FIGS. 1B, 2 and 4B to 4E, or may be disposed on the metal substrate 110 while having another layer sandwiched therebetween as for example shown in FIG. 3 described later. The electroluminescence display panel 120 may include a substrate, a thin film transistor array formed on the substrate, an anode formed on the thin film transistor array, an electroluminescence element formed on the anode, a cathode formed on the electroluminescence element, and an encapsulation unit formed on the cathode. The cathode may be a common electrode covering the display area. The cathode extends to a portion of the periphery area NA and can be electrically connected to the base voltage pad VSS provided in the periphery area NA.

The thin film transistor array may include a plurality of thin film transistors, a scan wiring for supplying a scan signal to the plurality of thin film transistors, and a data wiring for supplying an image signal to the plurality of thin film transistors. The semiconductor layer of the thin film transistor may be formed of amorphous silicon, polysilicon, oxide semiconductor, or the like. For example, the scan wiring and the data wiring may be made of one among aluminum (Al), aluminum alloy (AlNd), copper (Cu), copper alloy, molybdenum (Mo), and molybdenum-titanium (MoTi). However, the present disclosure is not limited thereto.

An insulation layer is formed between the various signal wirings. For example, the insulation layer may include silicon oxide (SiO2) or silicon nitride (SiNx).

The electroluminescence element may be disposed on the anode. The electroluminescence element is configured to include a light emitting layer. The electroluminescence element may be a single layer or a multilayer, and may further include at least one of a hole injecting layer, a hole transporting layer, and an electron transporting layer to improve the performance of the electroluminescence device. However, the present disclosure is not limited thereto. The light emitting layer may include a different host or dopant material for each sub-pixel depending on the wavelength of the emitting light. However, the present disclosure is not limited thereto.

The cathode may be disposed on the electroluminescence element. The cathode may be configured to cover the electroluminescence element. The cathode may be configured as a common electrode.

The encapsulation unit may be disposed on the cathode. The encapsulation unit functions to protect the electroluminescence element from oxygen and moisture. The encapsulation unit may be a single layer, but the present disclosure is not limited thereto, and may be a structure in which at least one inorganic insulating layer and at least one organic insulating layer are stacked.

The electroluminescence display panel 120 may be top-emission type configured to emit light toward the cover member 155.

The first contact hole H1 is configured to penetrate the electroluminescence display panel 120. The first contact hole H1 may be a through-hole. The first contact hole H1 may be a through-hole in the substrate of the electroluminescence display panel 120. The first contact hole H1 may be formed by an etching process, a laser cutting process, or a physical cutting process. The first contact hole H1 may be formed by a laser cutting and may be referred to as laser-formed. When cutting is done by a laser, the first contact hole H1 can be formed precisely. For example, the first contact hole H1 may be circular, and its diameter may be 0.5 mm to 1 mm. However, the present disclosure is not limited thereto.

In some aspects, the first contact holes may be configured to have various shapes such as rectangular, polygonal, elliptical, linear, but not circular.

The base voltage pad VSS is electrically connected to a cathode electrically connected to a plurality of pixels of the display area AA. The base voltage pad VSS is configured to be adjacent to the first contact hole H1. The base voltage pad VSS may be a metal electrode and may be formed of a metal such as aluminum (Al), aluminum alloy (AlNd), copper (Cu), copper alloy, molybdenum (Mo), molybdenum-titanium (MoTi), and titanium (Ti). However, the present disclosure is not limited thereto.

The base voltage pad VSS may be formed by patterning various metal layers used in forming a plurality of pixels of the display area AA. The various metal layers used for forming a plurality of pixels may be a metal layer forming a scan wiring for supplying a scan signal to a plurality of pixels, a data wiring for supplying a video signal, an anode, a cathode, or the like. However, the present disclosure is not limited thereto.

The first adhesive member 130 may be disposed on the electroluminescence display panel 120. For example, the first adhesive member 130 may be an optically clear adhesive (OCA). However, the present disclosure is not limited thereto.

The second contact hole H2 is configured to penetrate the first adhesive member 130. The second contact hole H2 may be a through-hole. The second contact hole H2 may be formed through an etching process, a laser cutting process, or a physical cut or the like. The second contact hole H2 may be formed by laser cutting and may be referred to as laser-formed. When cutting is done by the laser, the second contact hole H2 can be formed precisely. For example, the second contact hole H2 may be circular, and the diameter may be 1 mm to 1.5 mm. However, the present disclosure is not limited thereto. The second contact hole H2 is positioned to correspond to the first contact hole H1. The second contact hole H2 is configured to expose a portion of the base voltage pad VSS. An area of the second contact hole H2 may be wider than an area of the first contact hole H1, or in other words a cross-sectional area of the second contact hole H2 may be greater than a cross-sectional area of the first contact hole H1. The cross-sectional sectional area may be an area parallel to the surface of the metal substrate on which the electroluminescence display panel 120 is disposed—directly as for example shown in FIGS. 1B and 2 or with another layer interposed therebetween as for example shown in FIG. 3.

In some aspects, the second contact hole H2 may be configured to have various shapes, such as rectangular, polygonal, elliptical, linear, but not circular.

Figure 2:
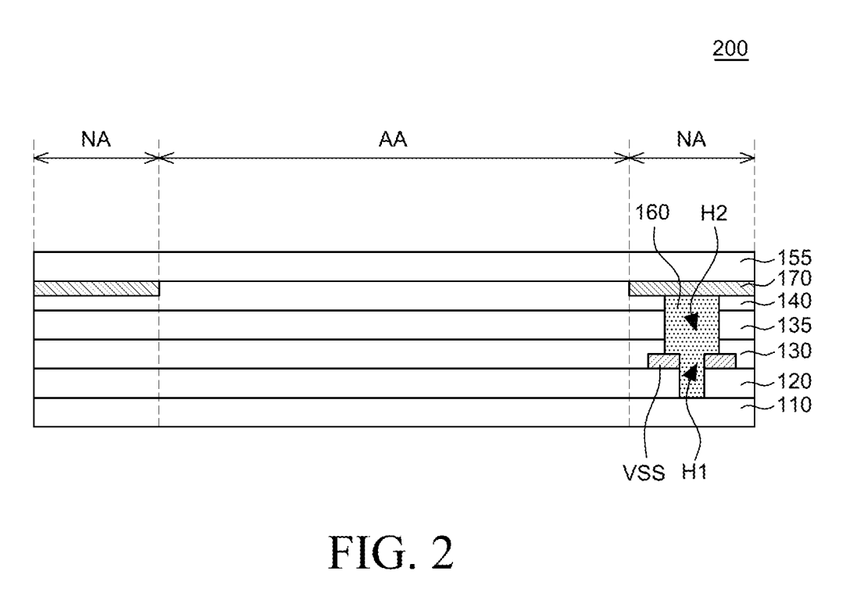
FIG. 2 is a cross-sectional view schematically illustrating a display apparatus according to another aspect of the present disclosure.

The base voltage pad VSS may be annular in shape and disposed around the first contact hole H1. The base voltage pad VSS may be disposed directly on the electroluminescence display panel 120. The base voltage pad VSS may be at least partly embedded in the first adhesive member 130, as shown in FIGS. 1B and 2, or may be at least partly embedded in another layer, such as a polarizer 125 shown in FIG. 3.

The conductive filler 160 may be applied into the first contact hole H1 and the second contact hole H2. The conductive filler 160 may be applied through a nozzle. As the conductive filler 160 is provided, at least a portion of the base voltage pad VSS exposed by the second contact hole H2 can be electrically connected to the metal substrate 110. Therefore, the cathode can receive the base voltage supplied through the metal substrate 110 through the contact hole structures H1, H2, and VSS.

At least one of the contact hole structures H1, H2, and VSS may be disposed in the periphery area NA. In other words, a plurality of the contact hole structures H1, H2, and VSS may be spaced apart from each other and arranged in the periphery area NA. The first contact hole H1 and the second contact hole H2 may be plural i.e. there may be a plurality of first contact holes H1 and a corresponding number of second contact holes H2 and a corresponding number of base voltage pads VSS. One contact hole structure H1, H2, and VSS may comprise one first contact hole H1, one second contact hole H2 and base voltage pad VSS. As the number of the contact hole structures H1, H2, and VSS increases, the stability of the base voltage can be improved.

The cover member 155 may be disposed on the first adhesive member 130. The cover member 155 may be tempered glass or transparent plastic. However, the present disclosure is not limited thereto, and the cover member 155 may be made of a transparent material capable of protecting the electroluminescence display panel 120. The cover member 155 is configured to cover the second contact hole H2. Therefore, the contact hole structures H1, H2, and VSS along with the contact filler 160 can be sealed between the cover member 155 and the metal substrate 110.

The display apparatus 100 according to an aspect of the present disclosure may be configured to include a metal substrate 110, an electroluminescence display panel 120, comprising a first contact hole H1 and a base voltage pad VSS adjacent to the first contact hole H1, disposed on the metal substrate 110, a first adhesive member 130, comprising a second contact hole H2 exposing at least a portion of an upper surface of the base voltage pad VSS, disposed on the electroluminescence display panel 120, and a conductive filler 160, filled in the first contact hole H1 and the second contact hole H2, electrically connecting the metal substrate 110 and the base voltage pad VSS. Therefore, there is an effect that the metal substrate 110 disposed on the bottom surface of the electroluminescence display panel 120 can be directly connected to the base voltage pad VSS through the contact hole structures H1, H2, and VSS penetrating the electroluminescence display panel 120. Accordingly, there is an effect that it is possible to remove the conductive tape for stabilizing the ground voltage.

FIG. 2 is a cross-sectional view schematically illustrating a display apparatus according to another aspect of the present disclosure.

Hereinafter, a display apparatus 200 according to another aspect of the present disclosure will be described with reference to FIG. 2. Since the display apparatus 200 according to another aspect of the present disclosure is substantially similar to the display apparatus 100 according to an aspect of the present disclosure, redundant features may be omitted merely for the sake of convenience of explanation. The description provided hereinabove with reference to FIGS. 1A-1B is applicable to FIG. 2.

For example, the display apparatus 200 according to another aspect of the present disclosure may be configured to selectively further include at least one among a touch panel 135, a second adhesive member 140, and a light shielding layer 170. In other words, the display apparatus 200 may be formed by further including in the display apparatus 100, described hereinabove in reference to FIG. 1B, at least one among the touch panel 135, the second adhesive member 140, and the light shielding layer 170.

The touch panel 135 may be disposed on the electroluminescence display panel 120. The touch panel 135 includes a touch electrode capable of recognizing a user's touch. The touch electrode may be, for example, a touch sensing electrode that senses a change in capacitance. A user's touch input can be sensed by the touch electrode corresponding to the display area AA of the electroluminescence display panel 120. The touch panel 135 is configured to include a second contact hole H2 disposed in the periphery area NA. The second contact hole H2 of the touch panel 135 may be configured to have substantially the same shape as the second contact hole H2 of the first adhesive member 130. For example, after the first adhesive member 130 and the touch panel 135 are laminated, a second contact hole H2 penetrating the first adhesive member 130 and the touch panel 135 may be formed simultaneously with laser cutting, in other words the second contact hole H2 formed in the first adhesive member 130 may extend through the touch panel 135. However, the present disclosure is not limited thereto.

In FIG. 2, the touch panel 135 is illustratively shown to include a second contact hole H2, but the second contact hole H2 may be formed only in the first adhesive member 130. Further, the touch panel 135 may be attached in advance to the cover member 155 by the second adhesive member 140. The touch panel 135 may not have the second contact hole H2.

The second adhesive member 140 may be disposed on the touch panel 135. Accordingly, the first adhesive member 130 may adhere the electroluminescence display panel 120 to the touch panel 135 and the second adhesive member 140 may adhere the touch panel 135 to the cover member 155. The second adhesive member 140 may be made of substantially the same material as the first adhesive member 130. However, the present disclosure is not limited thereto.

The second contact hole H2 can be formed by laser cutting after the first adhesive member 130, the touch panel 135, and the second adhesive member 140 are sequentially stacked. However, the present disclosure is not limited thereto.

In FIG. 2, the second adhesive member 140 is illustratively shown to include a second contact hole H2, but the second contact hole H2 may be formed only in the first adhesive member 130. The touch panel 135 and the second adhesive member 140 may be attached to the cover member 155 in advance and then they can be attached to the first adhesive member 130. In this case, the second adhesive member 140 may not have the second contact hole H2.

Simply put, the second contact hole H2 extends through the first adhesive member 130, and may optionally extend through the touch panel 135 and/or the second adhesive member 140. Thus, the second contact hole H2 may extend only through the first adhesive member 130 i.e. therefore the second contact hole H2 does not extend through the touch panel 135 and the second adhesive member 140. Alternatively, the second contact hole H2 may extend only through the first adhesive member 130 and the touch panel 135 i.e. therefore the second contact hole H2 does not extend through the second adhesive member 140. As a further alterative, the second contact hole H2 may extend through the first adhesive member 130 and the touch panel 135 and the second adhesive member 140.

The light shielding layer 170 is configured to shield visible light. The light shielding layer 170 may be configured to shield at least a portion of the periphery area NA. The light shielding layer 170 may be formed under the bottom surface of the cover member 155. The light shielding layer 170 is configured to shield at least one or shield all of the contact hole structures H1, H2, and VSS arranged in the periphery area NA. According to the above-described configuration, for example, the light shielding layer 170 may include at least one among a black pigment, a black resin, graphite, a black ink, a gravure ink, a black spray, a black enamel, and a low-reflective metal.

Referring to FIG. 2, the display apparatus 200 may be configured to further include a touch panel 135. In addition, the display apparatus 200 may be configured to further include the light-shielding layer 170. According to the above-described configuration, even if the touch panel 135 is further included, the contact hole structures H1, H2, and VSS can be formed substantially the same. In addition, it is also possible to stabilize the base voltage of the touch panel 135 by further forming a base voltage pad on the touch panel 135. In addition, the contact hole structure H1, H2, and VSS can be covered with the light shielding layer 170, thereby making it possible to prevent the user from recognizing the contact hole structures H1, H2, and VSS. In particular, even when a plurality of contact hole structures H1, H2, and VSS are formed, there is an effect that the light shielding layer 170 can shield all light.

Figure 3:
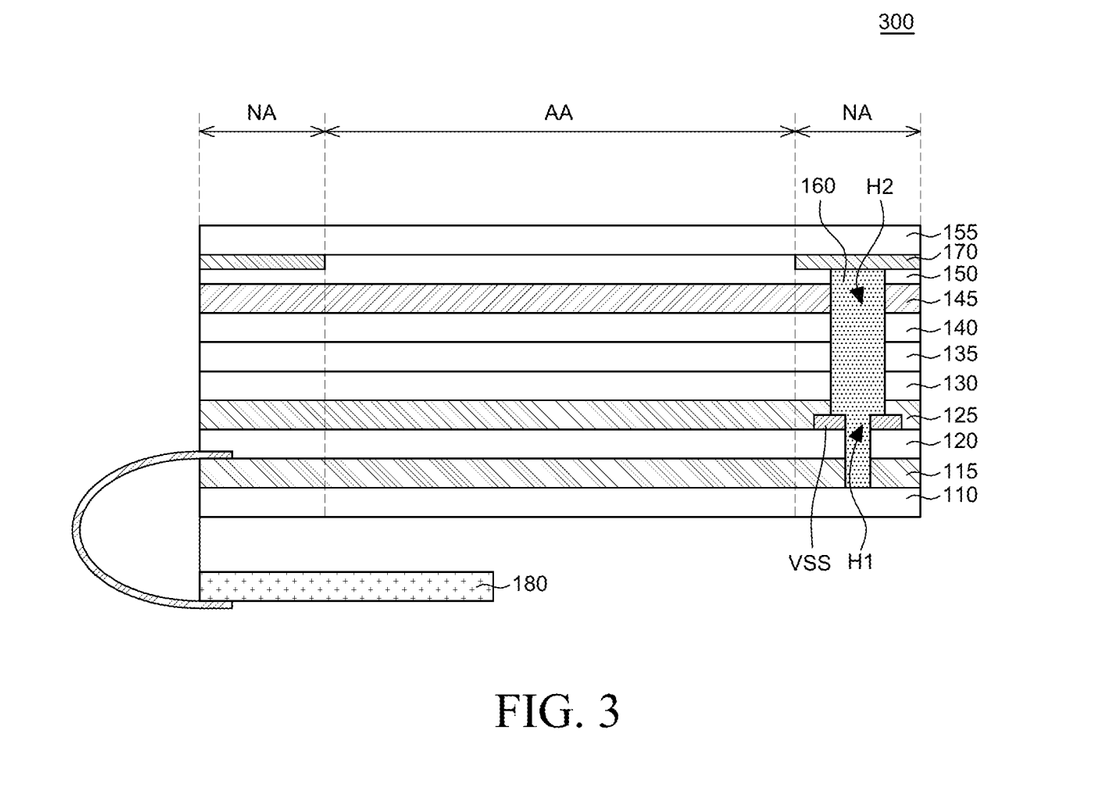
FIG. 3 is a cross-sectional view schematically illustrating a display apparatus according to another aspect of the present disclosure.

FIG. 3 is a cross-sectional view schematically illustrating a display apparatus according to another aspect of the present disclosure.

Hereinafter, a display apparatus 300 according to the other aspect of the present disclosure will be described with reference to FIG. 3. Since the display apparatus 300 according to the other aspect of the present disclosure is substantially similar to the display apparatus 200 according to another aspect of the present disclosure, redundant features may be omitted merely for the sake of convenience of explanation. The description provided hereinabove with reference to FIGS. 1A, 1B and 2 is applicable to FIG. 3.

For example, the display apparatus 300 according to the other aspect of the present disclosure may be configured to selectively further include at least one among a backplate 115, a polarizer 125, a light controlling film 145, a third adhesive member 150, and a printed circuit board 180. In other words, the display apparatus 300 may be formed by further including in the display apparatus 100 or 200, described hereinabove in reference to FIG. 1B or FIG. 2, at least one among the backplate 115, the polarizer 125, the light controlling film 145, the third adhesive member 150, and the printed circuit board 180.

The electroluminescence display panel 120 may be disposed on the backplate 115, or in other words the backplate 115 is disposed between the metal substrate 110 and the electroluminescence display panel 120. The backplate 115 supports the electroluminescence display panel 120, for example when the electroluminescence display panel 120 is a flexible display panel. The backplate 115 may be a plastic film having greater rigidity, and consequently supporting ability, than the electroluminescence display panel 120. As shown in FIG. 3, the first contact hole H1 extends through the backplate 115 such that the conductive filler 160 filled in the first contact hole H1 may be in contact with the metal substrate 110. If the first contact hole H1 is not formed in the backplate 115, the electroluminescence display panel 120 and the metal substrate 110 are electrically insulated. The backplate 115 may be attached to the bottom surface of the electroluminescence display panel 120. The first contact hole H1 may be formed after the backplate 115 is attached to the electroluminescence display panel 120. The first contact hole H1 may be formed in the backplate 115 and the electroluminescence display panel 120 at the same time i.e. simultaneously.

The polarizer 125 may be provided under the bottom surface of the first adhesive member 130. The second contact hole H2 of the polarizer 125 may be formed by laser cutting after the first adhesive member 130 and the polarizer 125 are attached. Therefore, the second contact hole H2 can be formed in the polarizer 125 and the first adhesive member 130 at the same time. Therefore, there is an effect that the base voltage pad VSS can be exposed. However, the present disclosure is not limited thereto, and the polarizer 125 may be configured to cover at least the display area AA. According to the above-described configuration, the polarizer 125 can absorb the external light incident on the display area AA while at least a portion of the upper surface of the base voltage pad VSS is exposed, thereby improving the ambient-light contrast ratio.

The light controlling film 145 may be provided on the upper surface of the second adhesive member 140. The light controlling film 145 may provide a function of narrowing the viewing angle of the display apparatus 300 when there is a special necessity. For example, in the case of navigation of a vehicle, an image displayed on the display apparatus during nighttime operation may be reflected on the front window of the vehicle, thereby interfering with the driving of the driver. In this case, the light controlling film 145 may be provided to optimize the viewing angle. The second contact hole H2 is formed by laser cutting after the first adhesive member 130, the touch panel 135, the second adhesive member 140, and the light controlling film 145 are sequentially stacked. The light controlling film 145 may be configured to cover at least the display area AA. However, the present disclosure is not limited thereto.

In FIG. 3, the light controlling film 145 is illustratively shown to include the second contact hole H2, but the second contact hole H2 may be formed only in the first adhesive member 130. The light controlling film 145 may be placed on the cover member 155 with the third adhesive member 150 and then attached to the first adhesive member 130. The light controlling film 145 may not have the second contact hole H2.

The third adhesive member 150 may be disposed on the light controlling film 145. The third adhesive member 150 can be formed by laser cutting after being laminated with various elements that can be attached with the third adhesive member 150. However, the present disclosure is not limited thereto.

Although the third adhesive member 150 is illustratively shown as including the second contact hole H2 in FIG. 3, the second contact hole H2 may be formed only in the first adhesive member 130.

Simply put, the second contact hole H2 extends through the first adhesive member 130, and may optionally extend through the polarizer 125 and/or the touch panel 135 and/or the second adhesive member 140 and/or the light controlling film 145 and/or the third adhesive member 150.

The printed circuit board 180 may be adhered by the electroluminescence display panel 120 and a flexible cable, or in other words the printed circuit board 180 may be electrically connected to the electroluminescence display panel 120 via an electrical conductor such as an electrically conductive cable and a flexible electrically conductive connector e.g. a flexible electrically conductive cable. The printed circuit board 180 may be electrically connected to the metal substrate 110. In this case, the printed circuit board 180 may be configured to supply a base voltage to the metal substrate 110. In particular, since the flexible cable is required to supply various driving signals and image signals, provision of the base voltage supply wiring for supplying the base voltage can be restricted. However, when the printed circuit board 180 is directly connected to the metal substrate 110, it is possible to stably supply the base voltage.

In FIG. 3, various elements that may be additionally provided have been described. That is, the display apparatus 300 may selectively include various elements, and even if various elements are included, the first contact hole H1 and the second contact hole H2 may be formed, thereby the base voltage pad VSS can be electrically connected to the metal substrate 110.

FIGS. 4A to 4E are cross-sectional views schematically illustrating a manufacturing process of a display apparatus according to an aspect of the present disclosure.

Figure 4A:
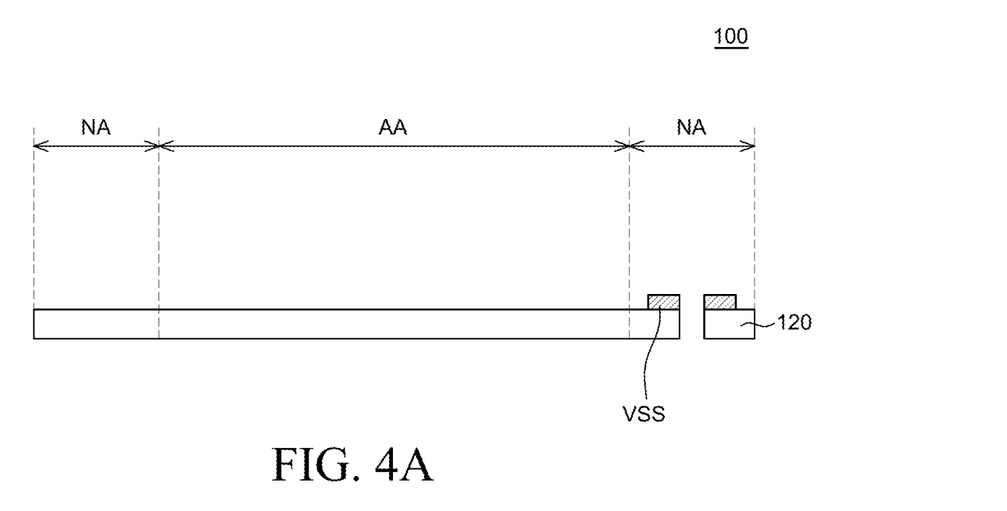
FIGS. 4A to 4E are cross-sectional views schematically illustrating a manufacturing process of a display apparatus according to an aspect of the present disclosure.

Referring to FIG. 4A, a first contact hole H1 is formed in an electroluminescence display panel 120 in which a base voltage pad VSS is formed in a periphery area NA for manufacturing the display apparatus 100.

Figure 4B:
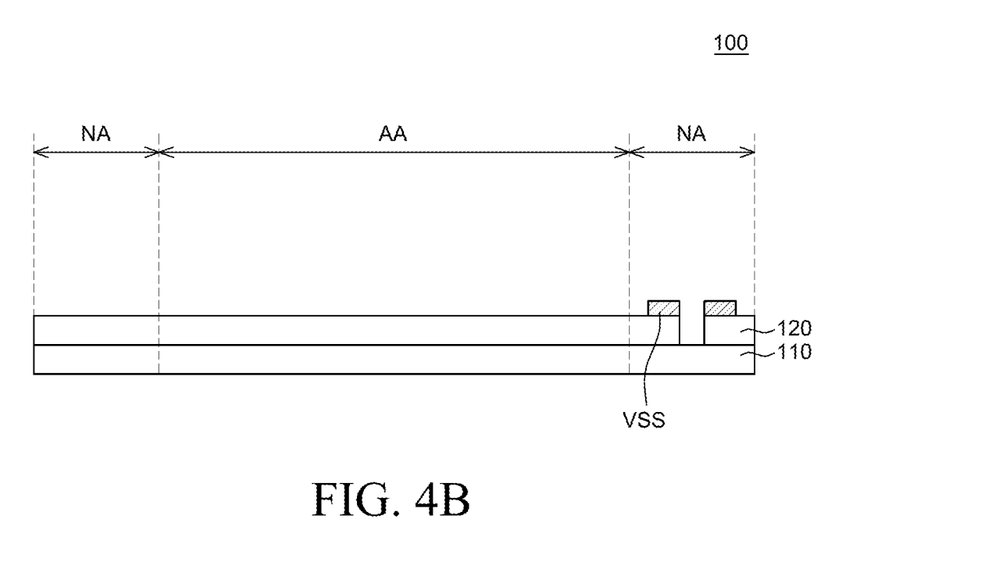

Referring to FIG. 4B, a metal substrate 110 is attached to the bottom surface of the electroluminescence display panel 120 for manufacturing of the display apparatus 100.

Figure 4C:
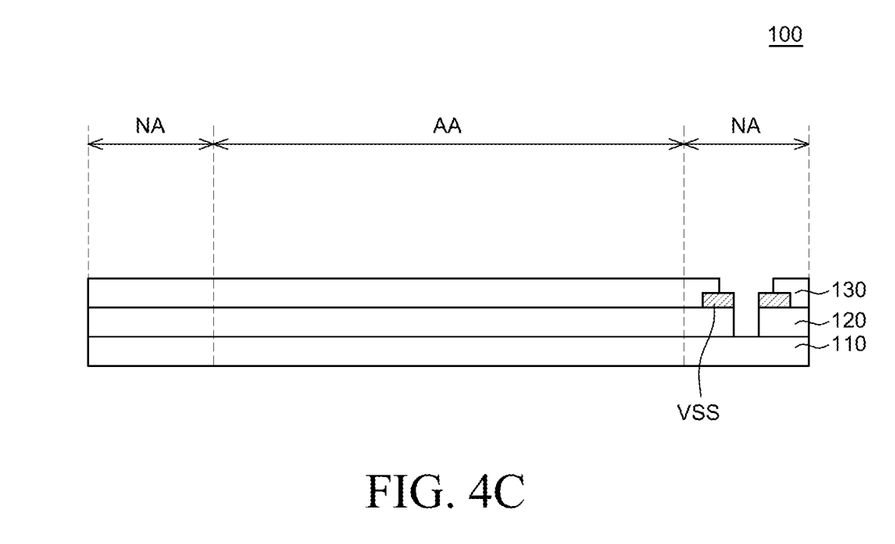

Referring to FIG. 4C, a first adhesive member 130 having a second contact hole H2 formed thereon is attached on the electroluminescence display panel 120, in order to manufacture the display apparatus 100. When the second contact hole H2 is attached, a portion of the upper surface of the base voltage pad VSS is exposed.

Figure 4D:
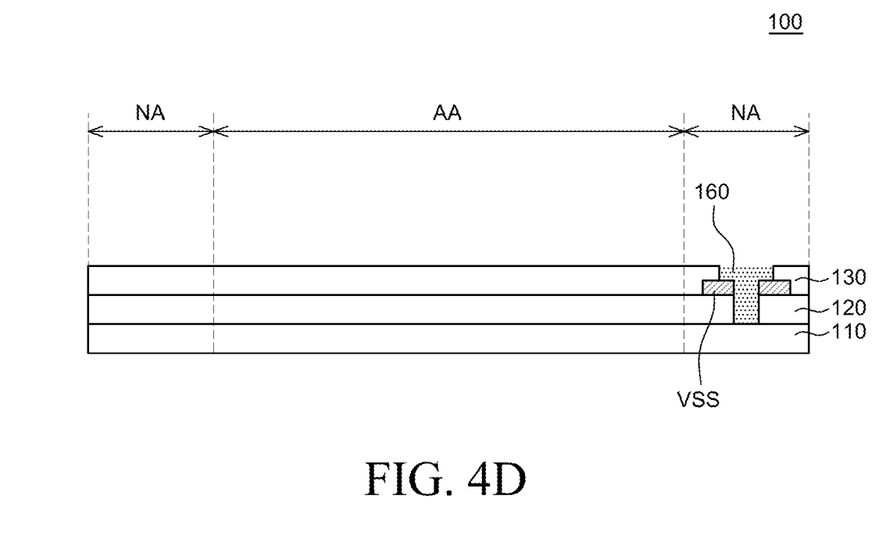

Referring to FIG. 4D, a conductive filler 160 is injected into the first contact hole H1 and the second contact hole H2 for manufacturing of the display apparatus 100. Therefore, the base voltage pad VSS of the electroluminescence display panel 120 is electrically connected to the metal substrate 110. Therefore, there is an effect that the metal substrate 110 disposed on the bottom surface of the electroluminescence display panel 120 can be directly connected to the base voltage pad VSS through the contact hole structures H1, H2, and VSS penetrating the electroluminescence display panel 120. Therefore, it is possible to remove a separate conductive tape for stabilizing the base voltage.

Figure 4E:
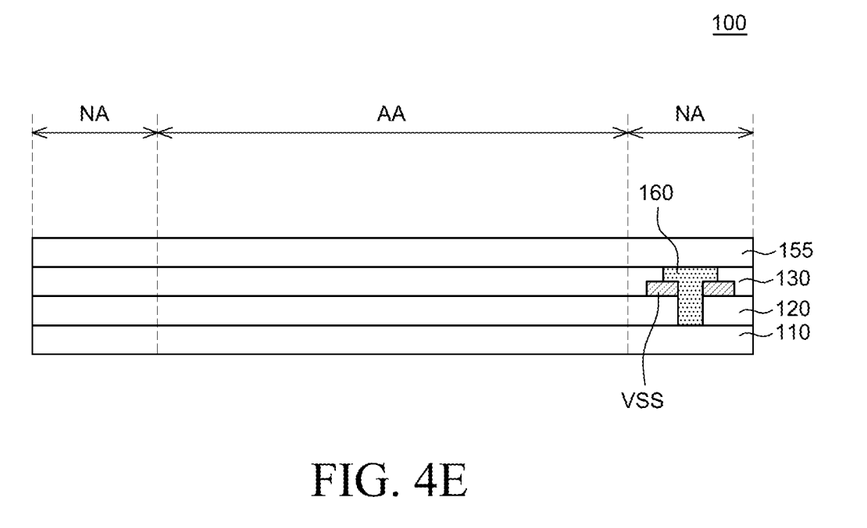

Referring to FIG. 4E, for manufacturing of the display apparatus 100, a cover member 155 is attached to the first adhesive member 130. Accordingly, the contact hole structures H1, H2, VSS can be sealed. The conductive filler 160 is sealed by the cover member 155, thereby reducing any undesirable electrical noise flowing into the conductive filler 160.

The exemplary aspects of the present disclosure can also be described as follows:

According an aspect of the present disclosure, a display apparatus 100, 200, and 300 may include a metal substrate 110, an electroluminescence display panel 120 including a first contact hole H1 and a base voltage pad VSS adjacent to the first contact hole H1 on the metal substrate 110, an adhesive member including a second contact hole H2 exposing at least a portion of the base voltage pad VSS on the electroluminescence display panel 120, and a conductive filler 160 filled in the first contact hole H1 and the second contact hole H2 electrically connecting the metal substrate 110 and the base voltage pad VSS.

An area of the second contact hole H2 may be wider than an area of the first contact hole H1.

The base voltage pad VSS may be electrically connected to a cathode of the electroluminescence display panel 120.

The display apparatus may include a printed circuit board 180, electrically connected to the electroluminescence display panel 120, electrically connected to the metal substrate 110.

The display apparatus may include a backplate 115, disposed between the electroluminescence display panel 120 and the metal substrate 110, including the first contact hole H1.

The display apparatus may include a polarizer 125, disposed on the electroluminescence display panel 120, configured to expose at least a portion of the base voltage pad VSS.

The display apparatus may include a cover member 155, arranged on the adhesive member, configured to cover the first contact hole H1 and the second contact hole H2.

The display apparatus may include a light shielding layer 170, disposed under a bottom surface of the cover member 155, configured to light shield the first contact hole H1 and the second contact hole H2.

The display apparatus may include a touch panel 135 including the second contact hole H2, disposed on the electroluminescence display panel 120.

The display apparatus may include an adhesive member including the second contact hole H2, disposed between the touch panel 135 and the electroluminescence display panel 120.

The display apparatus may include a light controlling film 145 including the second contact hole H2, disposed on the electroluminescence display panel 120.

The display apparatus may include an adhesive member including the second contact hole H2, disposed between the light controlling film 145 and the electroluminescence display panel 120.

The first contact hole H1 may be formed by a laser.

The second contact hole H2 may be formed by a laser.

The display apparatus may be divided into a display area and a periphery area, and at least one of the first contact hole, the second contact hole and the base voltage pad may be provided in the periphery area.

The cathode may be a common electrode covering a display area of the display apparatus and extending to a portion of a periphery area of the display apparatus to be electrically connected to the base voltage pad provided in the periphery area.

According to another aspect of the present disclosure, a display apparatus 100, 200, and 300 may include an electroluminescence display panel 120 including a display area AA in which a plurality of pixels is arranged and a cathode is formed, a periphery area NA in which a base voltage pad VSS electrically connected to the cathode is formed and disposed adjacent to the display area AA, and a first contact hole H1 passing through a substrate on which the plurality of pixels is formed, and a metal substrate 110, in contact with a conductive filler 160 covering the first contact hole H1 and at least a portion of an upper surface of the base voltage pad VSS, disposed under a bottom surface of the electroluminescence display panel 120.

The display apparatus may include a cover member 155 covering the first contact hole H1, disposed on the electroluminescence display panel 120.

At least one among a polarizer 125, a touch panel 135, and a light controlling film 145 may be further disposed between the electroluminescence display panel 120 and the cover member 155, and the further disposed at least one element may correspond to the first contact hole H1 and may be configured to include a second contact hole H2 configured to expose at least a portion of an upper surface of the base voltage pad VSS.

An adhesive member may be configured to be correspondingly disposed on at least one of an upper surface and a bottom surface of the further disposed at least one element.

The adhesive member may be configured to include a second contact hole H2.

The first contact hole H1 and the second contact hole that are plural may be disposed in the periphery area NA.

The foregoing description is merely illustrative of the present disclosure, and various modifications may be made by those skilled in the art without departing from the technical concept of the present disclosure. Therefore, the aspects disclosed in the specification of the present disclosure are not intended to limit the present disclosure. Thus, the scope of the present disclosure should be construed according to the following claims, and all the technical ideas within the scope of equivalents should be construed as being included in the scope of the present disclosure.

What is claimed is:

1. A display apparatus including:
a metal substrate;
an electroluminescence display panel disposed on the metal substrate and including a first contact hole and a base voltage pad adjacent to the first contact hole;
a first adhesive member disposed on the electroluminescence display panel and including a second contact hole exposing at least a portion of the base voltage pad; and
a conductive filler filled in the first and second contact holes and electrically connecting the metal substrate and the base voltage pad.

2. The display apparatus of claim 1, wherein an area of the second contact hole is wider than an area of the first contact hole.

3. The display apparatus of claim 1, wherein the base voltage pad is electrically connected to a cathode of the electroluminescence display panel.

4. The display apparatus of claim 3, wherein the cathode functions as a common electrode that covers a display area of the display apparatus and extends to a portion of a periphery area of the display apparatus to be electrically connected to the base voltage pad provided in the periphery area.

5. The display apparatus of claim 4, wherein at least one of a polarizer, a touch panel and a light controlling film is further disposed between the electroluminescence display panel and the cover member, and
wherein the at least one of the polarizer, the touch panel and the light controlling film corresponds to the first contact hole and includes the second contact hole configured to expose at least a portion of the upper surface of the base voltage pad.

6. The display apparatus of claim 1, further comprising a printed circuit board electrically connected to at least one of the electroluminescence display panel and the metal substrate.

7. The display apparatus of claim 1, further comprising a back plate disposed between the electroluminescence display panel and the metal substrate and including the first contact hole.

8. The display apparatus of claim 1, further comprising a polarizer disposed on the electroluminescence display panel and configured to expose at least a portion of the base voltage pad.

9. The display apparatus of claim 1, further comprising a cover member disposed on the first adhesive member and configured to cover the first and second contact holes.

10. The display apparatus of claim 9, further comprising a light shielding layer, disposed under a bottom surface of the cover member, configured to light shield the first and second contact holes.

11. The display apparatus of claim 1, further comprising a touch panel including the second contact hole and disposed on the electroluminescence display panel.

12. The display apparatus of claim 11, further comprising a second adhesive member including the second contact hole and disposed between the touch panel and the electroluminescence display panel.

13. The display apparatus of claim 1, further comprising a light controlling film including the second contact hole and disposed on the electroluminescence display panel.

14. The display apparatus of claim 13, further comprising a third adhesive member including the second contact hole and disposed between the light controlling film and the electroluminescence display panel.

15. The display apparatus of claim 1, wherein the first contact hole is formed by a laser.

16. The display apparatus of claim 1, wherein the second contact hole is formed by a laser.

17. The display apparatus of claim 1, wherein the display apparatus includes a display area and a periphery area, and at least one of the first contact hole, the second contact hole and the base voltage pad is provided in the periphery area.

18. The display apparatus of claim 17, further comprising a cover member covering the first contact hole and disposed on the electroluminescence display panel.

19. The display apparatus of claim 17, wherein the first contact hole includes a plurality of first contact holes disposed in the periphery area.

20. A display apparatus comprising:
an electroluminescence display panel including a display area in which a plurality of pixels and a cathode are arranged, a periphery area in which a base voltage pad electrically connected to the cathode is formed, and a first contact hole passing through a substrate on which the plurality of pixels is arranged and disposed adjacent to the display area; and a metal substrate, in contact with a conductive filler covering the first contact hole and at least a portion of an upper surface of the base voltage pad, wherein the metal substrate disposed under a bottom surface of the electroluminescence display panel.

21. The display apparatus of claim 20, further comprising an adhesive member disposed on at least one of an upper surface and a bottom surface of the at least one of a polarizer, a touch panel and a light controlling film.

22. The display apparatus of claim 21, wherein the adhesive member includes a second contact hole.

* * * * *